(12) United States Patent
Kasai

(10) Patent No.: US 10,228,411 B2
(45) Date of Patent: Mar. 12, 2019

(54) TESTING APPARATUS

(71) Applicant: Nidec-Read Corporation, Kyoto (JP)

(72) Inventor: Jun Kasai, Kyoto (JP)

(73) Assignee: Nidec-Read Corporation (JP)

(*) Notice: Subject to any disclaimer, the term of this patent is extended or adjusted under 35 U.S.C. 154(b) by 1049 days.

(21) Appl. No.: 14/470,293

(22) Filed: Aug. 27, 2014

(65) Prior Publication Data

US 2015/0066399 A1 Mar. 5, 2015

(30) Foreign Application Priority Data

Aug. 27, 2013 (JP) .................................. 2013-176093

(51) Int. Cl.
*G01R 31/14* (2006.01)
*G01R 31/12* (2006.01)
*G01R 31/28* (2006.01)

(52) U.S. Cl.
CPC ......... *G01R 31/14* (2013.01); *G01R 31/1272* (2013.01); *G01R 31/2812* (2013.01); *G01R 31/2805* (2013.01)

(58) Field of Classification Search
CPC .... G01R 31/14; G01R 31/28; G01R 31/2812; G01R 31/1272; G01R 31/2805; G01R 31/00; H05K 1/00
See application file for complete search history.

(56) References Cited

FOREIGN PATENT DOCUMENTS

| CN | 101292166 A | 10/2008 | |
|----|-------------|---------|---|
| JP | H07-146327 A | 6/1995 | |
| JP | 3546046 B2 | 6/2003 | |
| JP | 3536046 B | 3/2004 | |
| JP | 2009-109379 A | 10/2007 | |
| JP | 2008039498 A | * 2/2008 | |
| JP | 2008-089485 A | 4/2008 | |
| JP | 2008089485 A | * 4/2008 | ......... G01R 31/2812 |
| JP | 2008281408 A | * 11/2008 | |
| JP | 2012-013590 A | 1/2012 | |
| JP | 2012-018070 A | 1/2012 | |
| JP | 2012-047675 A | 3/2012 | |
| TW | 200825430 A | 6/2008 | |

OTHER PUBLICATIONS

Machine Translation of Yamashita (JP2008089485A).*
Machine Translation of Ban (JP2008281408A).*
Machine Translation of Yamashita (JP2008039498A).*

* cited by examiner

*Primary Examiner* — Paul D Lee
*Assistant Examiner* — Mark I Crohn
(74) *Attorney, Agent, or Firm* — Lerner, David, Littenberg, Krumholz & Mentlik, LLP

(57) ABSTRACT

A circuit board testing apparatus detects sparking and partial discharge between wiring patterns on a circuit board to determine if the circuit board is defective. A constant current source feeds a constant current to a wiring pattern to be tested. A voltage measurement part measures the resulting voltage at the wiring pattern. A normal state voltage gradient calculation part calculates a voltage gradient in a normal state where there is no sparking or partial discharge. A determination part determines whether the voltage gradient remains invariant, by comparing voltage measurement results within a predetermined range with an estimated value of the voltage based on the voltage gradient in the normal state. The determination part determines whether a circuit board is defective, on the basis of whether the voltage gradient remains invariant.

19 Claims, 7 Drawing Sheets

TESTING APPARATUS

CROSS REFERENCE TO RELATED APPLICATION

This application is based on, and claims priority from Japanese Patent Application No. 2013-176093, filed on Aug. 27, 2013, the contents of which are hereby incorporated by reference in their entirety.

BACKGROUND

Technical Field

This disclosure principally relates to a circuit board testing apparatus. More specifically, the disclosure relates to an apparatus for detecting if sparking and partial discharge occurs between wiring patterns on the printed circuit board when voltage is applied between the wiring patterns. If so, the printed circuit board may be rejected as having insufficient insulating properties.

Related Art

A known testing apparatus performs a test to determine the state of insulation between wiring patterns formed on a circuit board (i.e., as to whether a satisfactory insulation property is ensured), thereby determining whether the circuit board is a non-defective product. The test as to the insulation state involves applying a predetermined voltage to a pair of wiring patterns to be tested, and measuring a resistance value between the wiring patterns.

During such insulation test, sparking may occur between the wiring patterns because of the voltage applied to the wiring patterns. In the case where sparking occurs, there is a high possibility that the circuit board sustains some damage. Accordingly, it is preferred that a circuit board at which sparking occurs in the test be identified as a defective product.

In this respect, Japanese Patent No. 3,546,046 discloses a configuration for detecting occurrence of sparking, by detecting a trailing edge of a voltage waveform applied to a wiring pattern (i.e., by detecting a point at which a voltage becomes lower than a preceding voltage). The configuration disclosed in Japanese Patent No. 3,546,046 is capable of ensuring that a circuit board at which sparking during an insulation test is prevented from being mixed with non-defective products.

Recently, the pattern pitch on a printed circuit board has become narrower year by year. Hence, a partial electrical discharge may occur more frequently between wiring patterns during an insulation test. Also in the case where a partial discharge occurs, a circuit board may sustain damage. As in the case of a circuit board at which sparking occurs during the insulation test, it is preferred that a circuit board at which partial discharge occurs is identified as a defective product.

Unlike the case of sparking however, a trailing edge of a voltage is not observed in the case of partial discharge because only a small current is fed between the wiring patterns when there is a partial discharge. Hence, the configuration disclosed in Japanese Patent No. 3,546,046 is incapable of detecting if a partial discharge occurs during the insulation test.

SUMMARY

In view of the circumstances described above, an object of the disclosure is to provide a circuit board testing apparatus having a configuration capable of detecting the occurrence of both sparking and partial discharge during testing.

The technical challenges to be solved by the disclosure are as described above. Hereinafter, a description will be given of solutions to those challenges and the advantageous effects of the solutions.

According to an exemplary embodiment, a testing apparatus is configured to perform a test of the electrical insulation between wiring patterns formed on a circuit board, and includes the following constituent elements. The testing apparatus includes a constant current source, a voltage measurement part and a determination part. The constant current source feeds a constant current to a wiring pattern to be tested. The voltage measurement part measures the corresponding voltage as a function of time at the wiring pattern. The determination part determines whether the circuit board is acceptable, on the basis of whether the measured voltage as a function of time exhibits an invariant (i.e., relatively constant) voltage gradient over a predetermined time interval. As used herein, the voltage gradient corresponds to the ratio of the change in voltage, $\Delta V$, over a corresponding change in time, $\Delta t$.

That is, when a wiring pattern is fed with constant current, the measured voltage gradient will remain invariant when neither sparking nor partial discharge occurs between the wiring patterns. However, the voltage gradient varies when sparking or partial discharge occurs between the wiring patterns. Therefore, it is possible to detect the occurrence of sparking or partial discharge, on the basis of whether or not the voltage gradient remains invariant. The value of the voltage gradient may differ for each wiring pattern under test. In the case where neither sparking nor partial discharge occurs, however, the voltage gradient remains invariant in all the wiring patterns. Hence, it is possible to make a highly accurate determination of the insulation state between wiring patterns, irrespective of differences in voltage gradient among the wiring patterns, by determining whether or not the voltage gradient remains invariant over a predetermined time interval.

The testing apparatus may be configured as described below. In particular, the testing apparatus includes a normal state voltage gradient calculation part. As further explained herein, the normal state voltage gradient calculation part calculates the voltage gradient in a normal state where there is no sparking or partial discharge, by measuring voltages that are below a predetermined voltage gradient calculation threshold value. At such low voltages there should be no sparking or partial discharge between wiring patterns. The determination part determines whether the voltage gradient remains invariant at higher voltage levels, by comparing voltage measurement results with an estimated value of the voltage based on the voltage gradient measured in the normal state.

In other words, there is a low possibility that sparking or partial discharge occurs between the wiring patterns when the voltage across the wiring patterns is low. Accordingly, it is possible to calculate the voltage gradient in the normal state (i.e., the state in which no sparking on partial discharge occurs), by taking voltage measurements when the voltage at the wiring pattern is less than a predetermined value. It is then possible to accurately determine whether sparking or partial discharge occurs at the wiring pattern, by comparing voltage measurements at the wiring pattern with an estimated value based on the voltage gradient determined for the normal state.

The testing apparatus may be configured as described below. The determination part determines whether the voltage gradient remains invariant, on the basis of voltage measurements taken within a range which is equal to or more than a predetermined first threshold value and is less than a predetermined second threshold value.

That is, the range where the voltage gradient is regarded to remain invariant is limited even in the normal state (the state in which no sparking or partial discharge occurs). Thereafter, it is possible to accurately determine whether sparking or partial discharge occurs, by determining whether the voltage gradient remains invariant, on the basis of the measurement result within the limited range.

The foregoing and other objects, features, aspects and advantages of the disclosed invention will become more apparent from the following detailed description, when taken in conjunction with the accompanying drawings.

DETAILED DESCRIPTION

Figure 1:
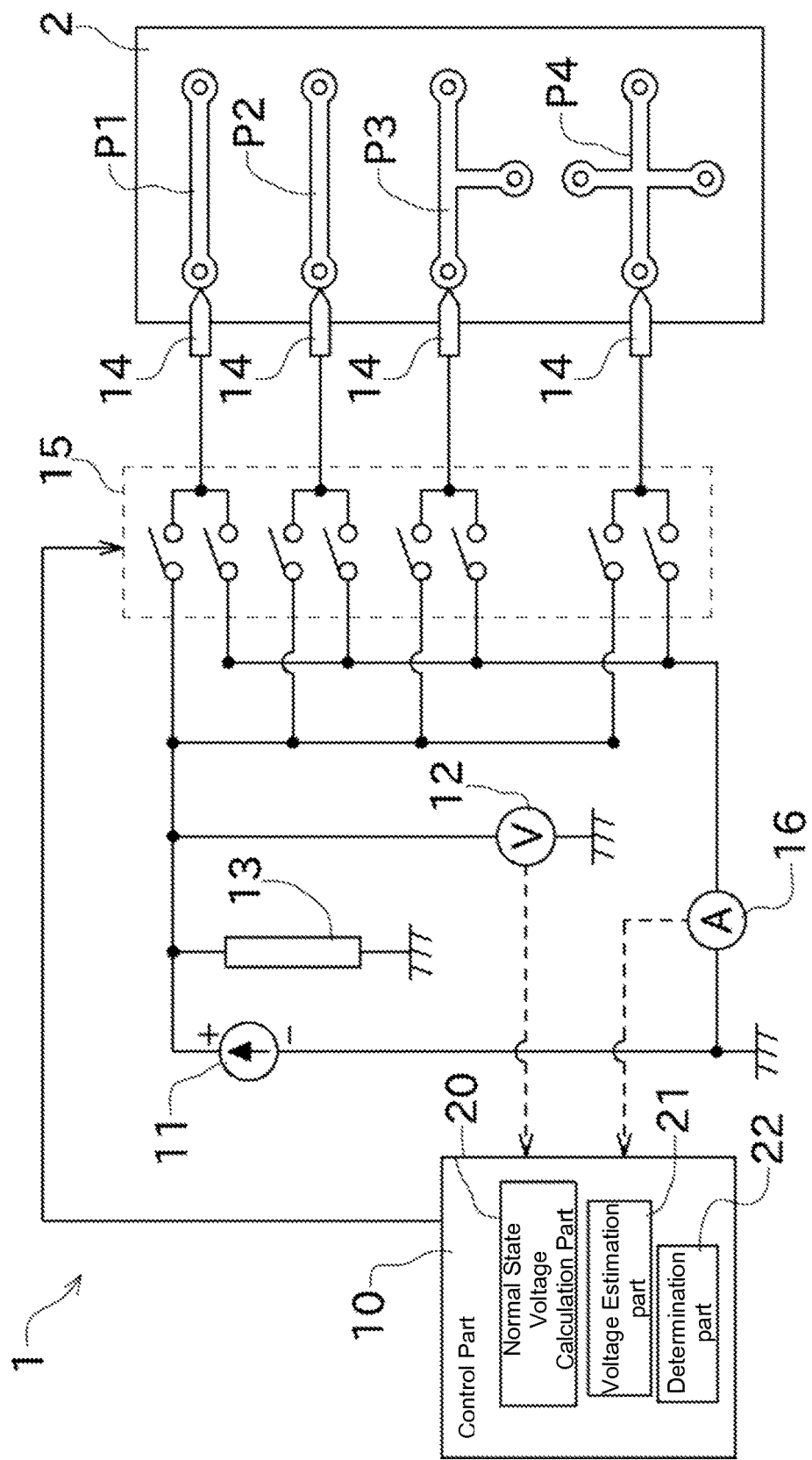
FIG. 1 is a schematic circuit diagram illustrating a general configuration of a testing apparatus according to one embodiment.

With reference to the drawings, the following description will be given of various embodiments of the invention. FIG. 1 illustrates a testing apparatus 1 according to one embodiment. The testing apparatus 1 is configured to determine whether acceptable electrical insulation exists between wiring patterns formed on a circuit board 2. Although an actual circuit board has a large number of complicated wiring patterns, the circuit board 2 illustrated in FIG. 1 has four simple wiring patterns P1 to P4, for the simplification of illustration.

The testing apparatus 1 includes a controller 10, a constant current source 11, a voltage measurement part 12, a limiter circuit 13, a probe 14, a switch circuit 15 and a current measurement part 16.

The controller 10 is a computer equipped with hardware including, for example, a CPU (Central Processing Unit) serving as a processing device, and a ROM (Read Only Memory) and a RAM (Random Access Memory) each serving as a memory device. In the controller 10, for example, the ROM stores therein software such as a program for controlling the respective parts in the testing apparatus 1. The control part 10 includes both hardware and the software, thereby controlling the respective parts in the testing apparatus 1.

The testing apparatus 1 includes a large number of probes 14. Each of the probes 14 is a rod-shaped or needle-shaped electrically conductive member, and is contactable with one of the wiring patterns P1 to P4 on the circuit board 2.

The constant current source 11 has a positive-side terminal and a negative-side terminal, and provides a constant current output. The negative-side terminal of the constant current source 11 is grounded in this exemplary embodiment.

The limiter circuit 13 prevents the potential difference between the positive-side terminal and the negative-side terminal of the constant current source 11 from exceeding a predetermined upper-limit voltage.

The current measurement part 16 includes a positive-side terminal and a negative-side terminal, and detects the magnitude of a current flowing from the positive-side terminal to the negative-side terminal. The current measurement part 16 outputs the measurement result to the controller 10. As shown in FIG. 1, the negative-side terminal of the current measurement part 16 is grounded in this exemplary embodiment.

As shown in FIG. 1, the switch circuit 15 can switch each of the probes 14 so that the probe is either connected to the positive-side terminal of the constant current source 11, the positive-side terminal of the current measurement part 16, or to neither the constant current source 11 nor the current measurement part 16. The switch circuit 15 is controlled by the controller 10.

The controller 10 appropriately controls the switch circuit 15, thereby connecting any probe 14 to the positive-side terminal of the constant current source 11. Thus, the constant current source 11 can feed a constant current to the wiring pattern with which the probe 14 is in contact. The wiring pattern fed with the constant current from the constant current source 11 is referred to herein as a "positive-side pattern". The controller 10 appropriately controls the switch circuit 15, to connect any probe 14 to the positive-side terminal of the current measurement part 16. Thus, the current measurement part 16 can measure the current flowing through the wiring patterns with which the probe 14 and part 16 are in contact. The wiring pattern connected to the current measurement part 16 is referred to herein as a "negative-side pattern".

The voltage measurement part 12 measures a voltage at a positive-side pattern and outputs the measurement result to the controller 10.

Figure 2:
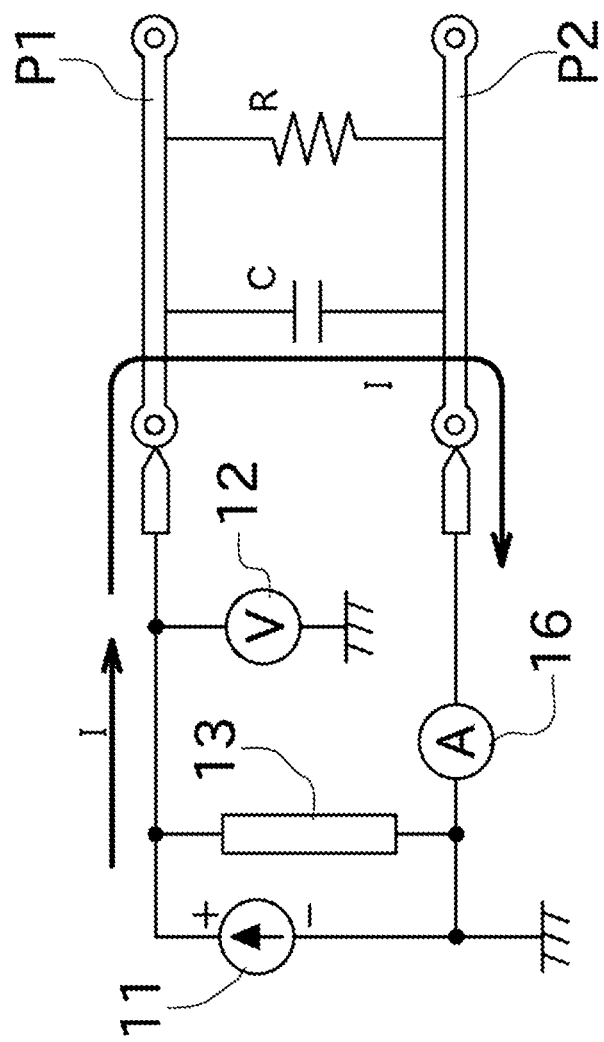
FIG. 2 is a simplified circuit diagram illustrating a situation wherein the testing apparatus performs a test on wiring patterns.

Next, more specific description will be given with reference to FIG. 2. FIG. 2 illustrates a case where a pair of wiring patterns P1 and P2 is defined as a target to be tested. With regard to the pair of wiring patterns P1 and P2 to be tested, the wiring pattern P1 is defined as the positive-side pattern and the wiring pattern P2 is defined as the negative-side pattern in FIG. 2. The unnecessary constituent elements for the description are appropriately omitted from FIG. 2.

As illustrated in FIG. 2, the pair of wiring patterns P1 and P2 has a parasitic capacitor C. Accordingly, when the constant current source 11 feeds a current to the positive-side pattern P1, the parasitic capacitor C is electrically charged. This electrical charging causes a rise in voltage V at the positive-side pattern P1. The voltage V is measured by the voltage measurement part 12.

As illustrated in FIG. 2, moreover, it is considered that a resistor R is formed between the wiring patterns P1 and P2. The resistor R ideally has an infinite value, but actually has a finite value. Accordingly, the resistor R may be fed with a current Ir (see FIG. 3). The current Ir flows into the negative-side pattern P2, and is measured by the current measurement part 16.

Figure 3:
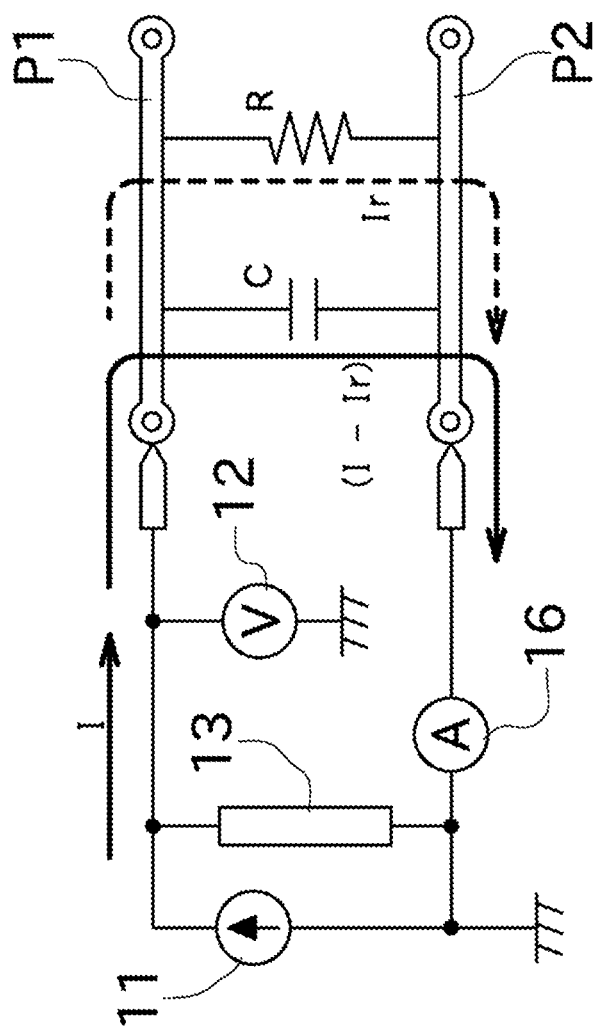
FIG. 3 is a circuit diagram illustrating a case where a current flows through the resistance (modeled by resistor R) that exists between the wiring patterns.

As illustrated in FIGS. 2 and 3, the negative-side pattern P2 may also be fed with a current for electrically charging the parasitic capacitor C. Accordingly, during the period that the parasitic capacitor C is electrically charged, the current measurement part 16 measures the sum of the current for electrically charging the parasitic capacitor C and the current Ir flowing through the resistor R. After the parasitic capacitor C is electrically charged, however, the negative-side pattern P2 is fed with no current for electrically charging the parasitic capacitor C. Therefore, the current measurement part 16 measures only the current Ir flowing through the resistor R.

The measurement results output from the voltage measurement part 12 and current measurement part 16 are subjected to sampling by an A/D (analog-to-digital) converter (not illustrated) in a predetermined sampling cycle, and then the resultant digital discrete data are acquired by the controller 10. In this description of an illustrative embodiment, a "measurement result" on a voltage or a current refers to a measurement result in the form of digital data to be acquired by the controller 10, as described above.

With reference to the flowchart shown in FIG. 4, a description will next be given of a circuit board testing method to be performed by the testing apparatus 1 according to an illustrative embodiment.

First, the controller 10 selects a pair of wiring patterns whose insulation property is to be tested, from among a plurality of wiring patterns formed on a circuit board (step S101). The controller 10 appropriately controls the switch circuit 15, thereby setting one of the wiring patterns to be tested at a positive-side pattern, and also setting the other wiring pattern at a negative-side pattern. In the description, as illustrated in FIGS. 2 and 3, the wiring pattern P1 is defined as the positive-side pattern and the wiring pattern P2 is defined as the negative-side pattern. Next, the constant current source 11 feeds a current to the positive-side pattern P1 (step S102). Moreover, the controller 10 measures the time elapsed since the positive-side pattern P1 is fed with the current (step S103).

Figure 5:
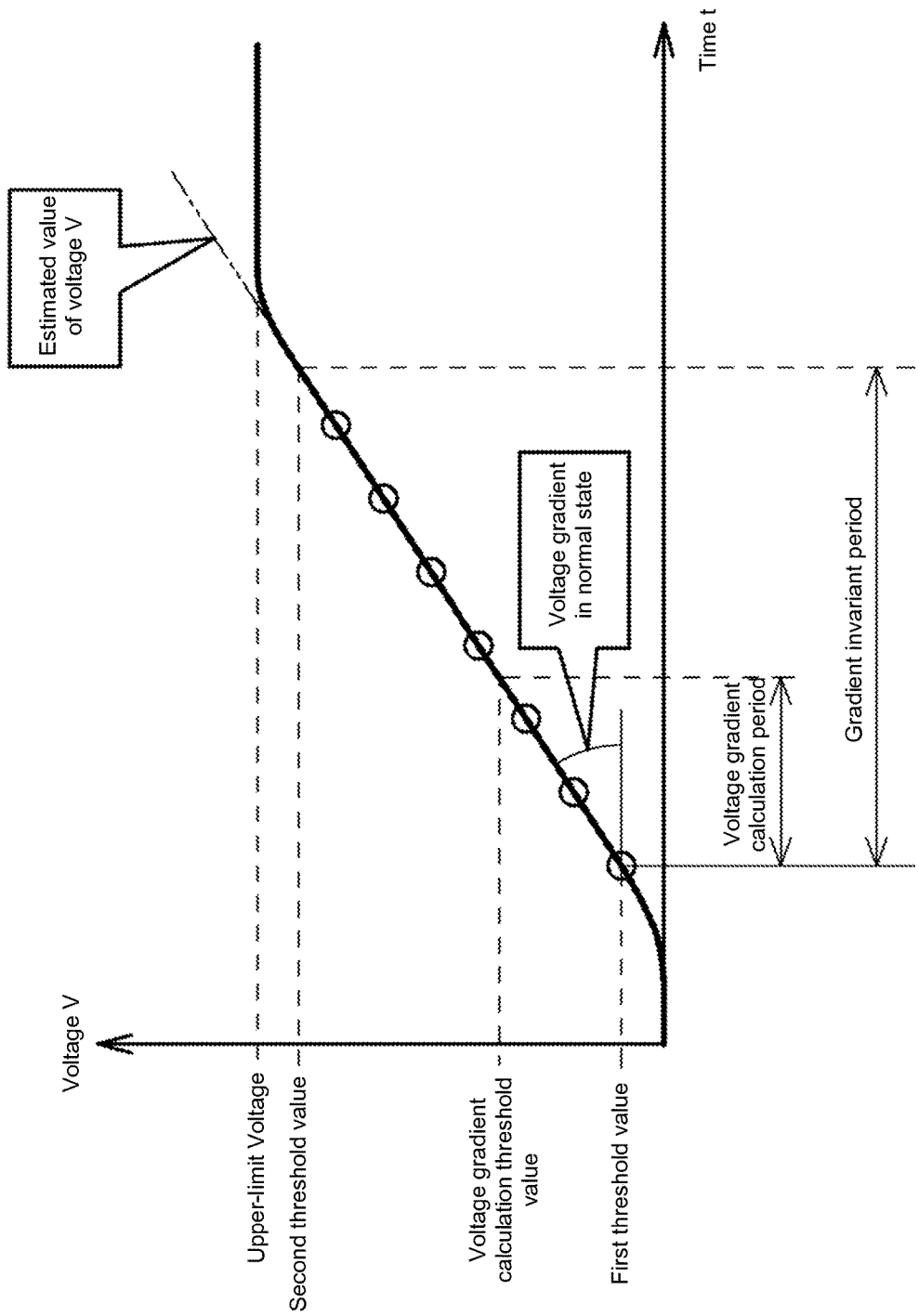
FIG. 5 is a graph illustrating a change of voltage over time at a positive-side pattern in a normal state.
Figure 6:
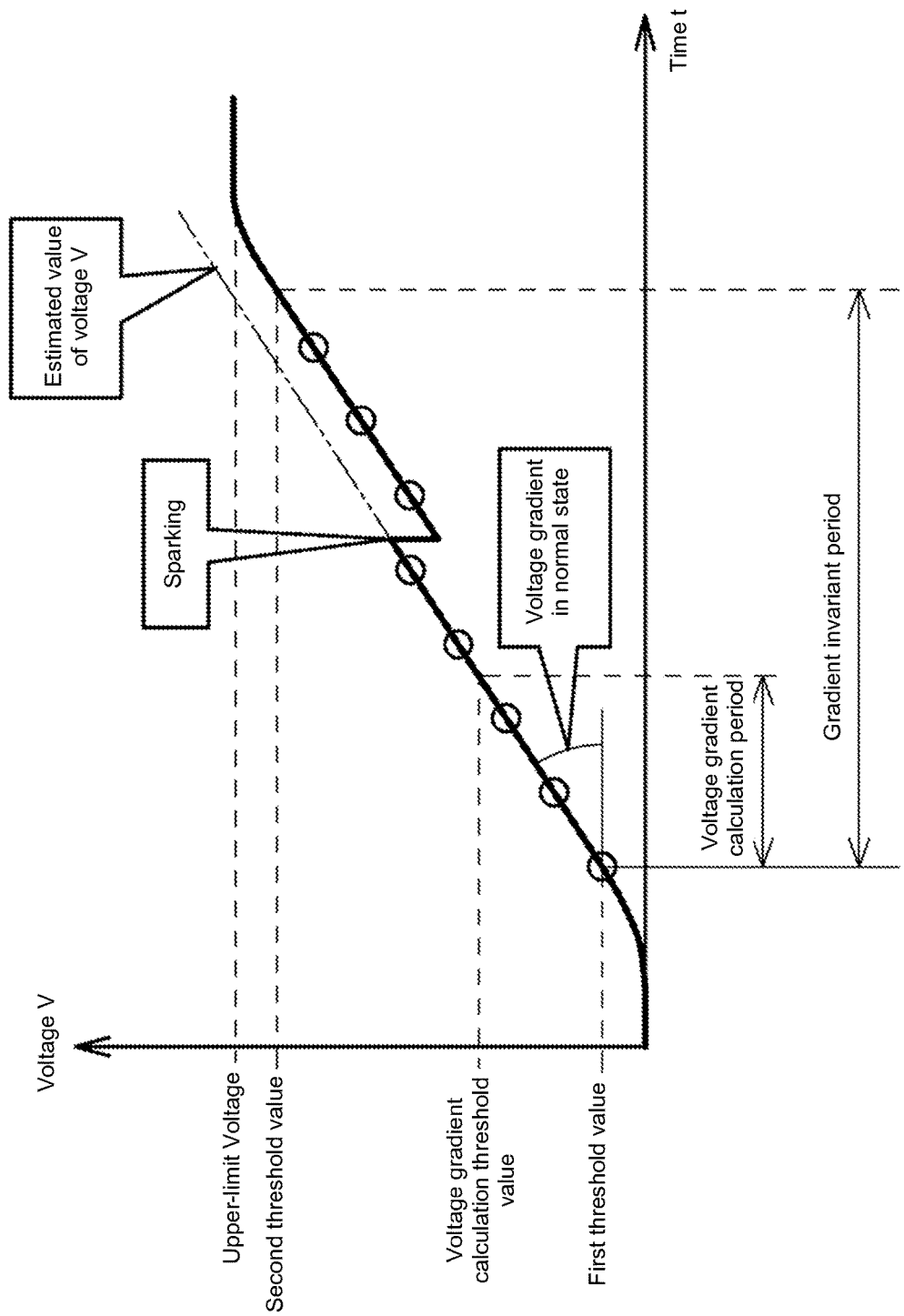
FIG. 6 is a graph illustrating a change of the voltage over time at the positive-side pattern in a case where sparking occurs.
Figure 7:
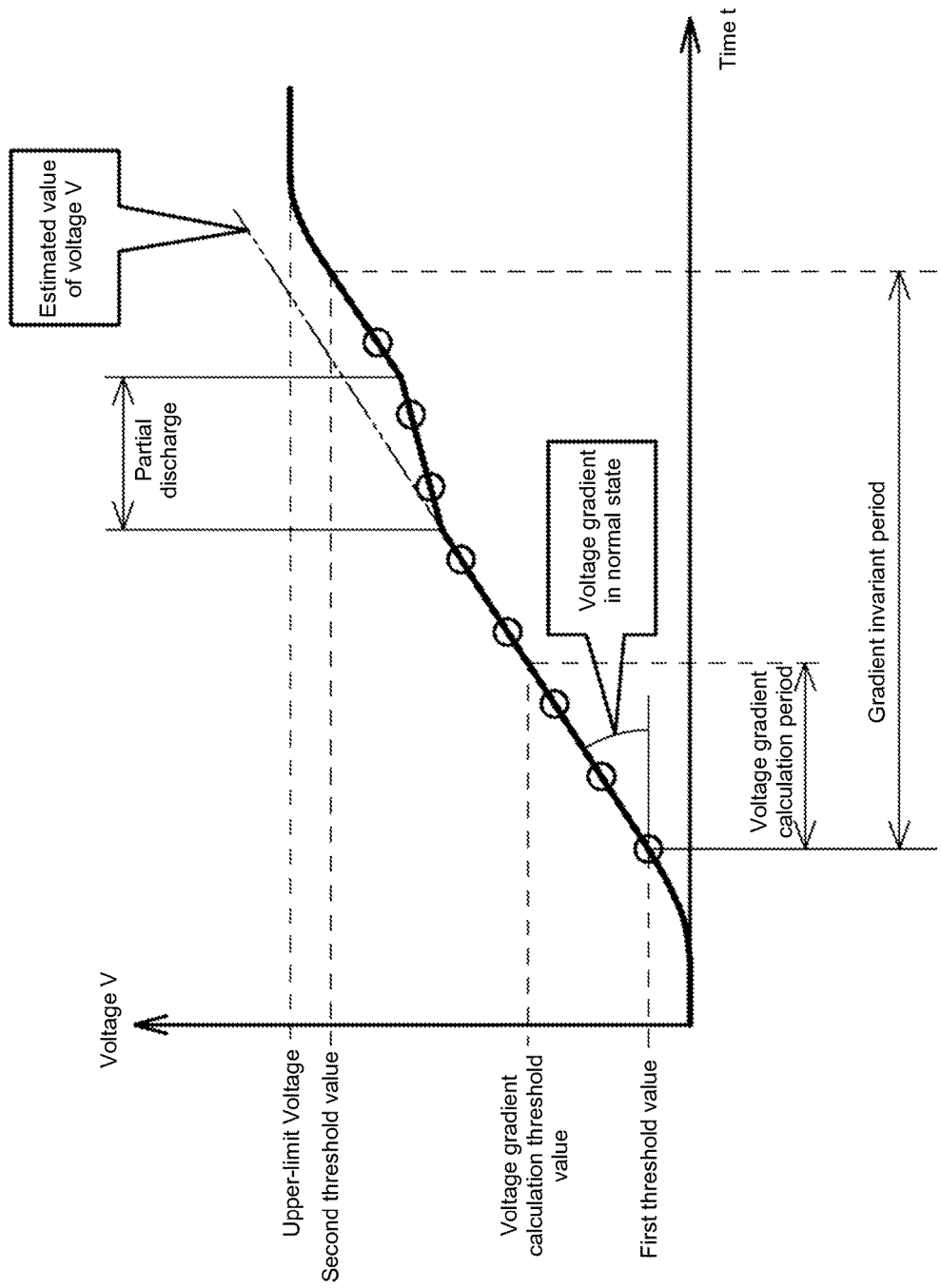
FIG. 7 is a graph illustrating a change of the voltage over time at the positive-side pattern in a case where partial discharge occurs.

Brief descriptions will be given herein of the temporal change in voltage V at the positive-side pattern P1 under different conditions, as the positive-side pattern P1 is fed with a constant current. FIGS. 5 to 7 are graphs schematically illustrating the change of the voltage V at the positive-side pattern P1, as a function of time.

The positive-side pattern P1 and negative-side pattern P2 forms a parasitic capacitor C, as described above. Before the positive-side pattern P1 is fed with the current, the charge on the parasitic capacitor C is zero, and the voltage V at the positive-side pattern P1 is zero. When the positive-side pattern P1 is fed with current, the parasitic capacitor C is electrically charged. Thus, the voltage V at the positive-side pattern P1 gradually rises as illustrated in FIGS. 5 to 7.

As described above, the testing apparatus 1 includes the limiter circuit 13 for preventing the potential difference between the positive-side terminal and the negative-side terminal of the constant current source 11 from exceeding the upper-limit voltage. As illustrated in FIGS. 5 to 7, accordingly, when the voltage V at the positive-side pattern P1 approaches the upper-limit voltage, the limiter circuit 13 retards the rise in the voltage V, so that the voltage V is finally fixed at the upper-limit voltage. After a sufficient time has elapsed since the current is fed in step S102, the voltage V at the positive-side pattern P1 becomes stable at the upper-limit voltage. Moreover, when the voltage V at the positive-side pattern P1 becomes stable, the current flowing through the negative-side pattern P2 also becomes stable.

The controller 10 maintains the feeding of current to the positive-side pattern P1 until the time elapsed since the measurement is started in step S103 exceeds a predetermined termination time (determination in step S105). The termination time is set in advance at such a sufficient time that the voltage at the positive-side pattern P1 and the current flowing through the negative-side pattern P2 become stable.

When the constant current is fed to the positive-side pattern P1, the parasitic capacitor C is electrically charged, so that the voltage V at the positive-side pattern P1 rises. If the insulation is not adequate, sparking or partial discharge may occur between the positive-side pattern P1 and a different wiring pattern. The controller 10 monitors whether sparking or partial discharge occurs between the positive-side pattern P1 and the different wiring pattern (step S104). When sparking or partial discharge is detected, the controller 10 determines that the circuit board is a defective product (step S108), and then terminates the processing flow. The detection of sparking or partial discharge will be described later.

In the case where the termination time has elapsed without detection of sparking or partial discharge (determination in step S105), it is considered that the voltage V at the positive-side pattern P1 and the current flowing through the negative-side pattern P2 become satisfactorily stable. The controller 10 allows the voltage measurement part 12 to measure the voltage V at the positive-side pattern P1, and also allows the current measurement part 16 to measure the current Ir flowing through the negative-side pattern P2 (step S106).

Next, the controller 10 calculates a value of the resistor R between the wiring patterns P1 and P2 to be tested, on the basis of the voltage V and the current Ir each measured in step S106 (R=V/Ir), and determines whether the value of the resistor R is equal to or more than a predetermined determination threshold value Rref (step S107). When the value of the resistor R between the wiring patterns P1 and P2 to be tested is less than the determination threshold value Rref, the controller 10 determines that the insulation property between the wiring patterns P1 and P2 is not satisfactory, determines that the circuit board is a defective product, and terminates the processing flow (step S108).

On the other hand, when the value of the resistor R between the wiring patterns P1 and P2 to be tested is equal to or more than the determination threshold value Rref, the controller 10 determines that the insulation property between the wiring patterns P1 and P2 is favorable. In this case, the controller 10 determines whether the test is finished for all the pairs of wiring patterns to be tested (determination in step S109). When the test is not finished yet, the controller 10 continues the test for the next pair of wiring patterns. When the test is finished for all the pairs of wiring patterns, the controller 10 determines that the circuit board is a non-defective product, and terminates the processing flow (step S110).

According to the testing method described above, it is possible to determine, as a non-defective product, only a circuit board in which an insulation property between wiring patterns is satisfactorily ensured. Moreover, it is possible to identify, as a defective product, a circuit board at which sparking or partial discharge occurs in the test. Therefore, the reliability of a circuit board determined to be a non-defective product is improved.

Next, description will be given of the method of detecting sparking or partial discharge in step S104.

In step S104, the voltage V at the positive-side pattern P1 gradually rises as described above. Herein, consideration is given to a case where the insulation property between the wiring patterns P1 and P2 to be tested is satisfactory and no sparking or partial discharge occurs between the wiring patterns P1 and P2 (the resistor R has an ideally infinite value). In this case, the current Ir flowing through the resistor R can be neglected (see FIG. 2). Accordingly, the current I to be fed from the constant current source 11 is entirely used for electrically charging the parasitic capacitor C. In this case, the following equation is established on the basis of Q=CV, (where Q is the charge on capacitor C).

$$\Delta V = I/C \times \Delta t \qquad (1)$$

The current I is regarded to be fixed because the constant current source 11 is configured to feed a constant current. The value of the parasitic capacitor C is also considered to be fixed in the test. Accordingly, it is apparent from Equation (1) that the change of the voltage V at the positive-side pattern P1 over time ($\Delta V/\Delta t$) is constant. In the description herein, the ratio $\Delta V/\Delta t$ is referred to as a "voltage gradient".

FIG. 5 is a graph illustrating the temporal change of the voltage V at the positive-side pattern P1 in the case where no sparking or partial discharge occurs between the wiring patterns P1 and P2 to be tested (in the case where Equation (1) is established). As shown in FIG. 5, the voltage V at the positive-side pattern P1 linearly rises because the voltage gradient in this case remains invariant.

However, the range over which the voltage gradient ($\Delta V/\Delta t$) is regarded to remain invariant is limited. As illustrated in FIG. 5, for example, the voltage gradient may be unstable at the time when the voltage V at the positive-side pattern P1 is close to zero (immediately after the current is fed to the positive-side pattern P1). As illustrated in FIG. 5, moreover, when the voltage V approaches the upper-limit voltage, the voltage gradient varies due to the effect of the voltage limiter circuit 13.

Thus, at times when the voltage V at the positive-side pattern P1 is close to zero and is close to the upper-limit voltage, the voltage gradient is not expected to remain invariant (i.e., Equation (1) is not met). In the range of the voltage V where the voltage gradient is regarded to remain invariant, the lower-limit value is referred to as a "first threshold value" and the upper-limit value is referred to as a "second threshold value". The time period during which the voltage V at the positive-side pattern P1 falls between the first threshold value and the second threshold value (i.e., the time period in which the voltage gradient is regarded to remain invariant) is referred to as the "gradient invariant period". The first threshold value and the second threshold value are set in advance such that the range where the voltage gradient is regarded to remain invariant (the range where Equation (1) is established) can be appropriately specified.

Next, consideration is given to a case where sparking or partial discharge occurs between the wiring patterns P1 and P2 being tested. When sparking or partial discharge occurs between the wiring patterns P1 and P2, charge in the positive-side pattern P1 is released from the positive-side pattern P1 to the negative-side pattern P2. In this case, it can be considered that the value of the resistor R between the wiring patterns P1 and P2 becomes temporarily small and the current Ir temporarily flows into the resistor R (see FIG. 3). As for the constant current I to be fed from the constant current source 11, the current Ir flows through the resistor R. Therefore, the current available for electrically charging the parasitic capacitor C is I−Ir.

$$\Delta V = (I-Ir)/C \times \Delta t \qquad (2)$$

It is apparent from Equation (2) that the voltage gradient ($\Delta V/\Delta t$) becomes smaller as the current Ir that flows into the resistor R is larger.

FIG. 6 illustrates a case where sparking occurs between the wiring patterns P1 and P2 being tested. In the case where sparking occurs, an instantaneously large current Ir flows into the resistor R between the wiring patterns P1 and P2 (i.e., the current Ir becomes instantaneously large in Equation (2)). As illustrated in FIG. 6, consequently, the voltage V at the positive-side pattern P1 drops and the voltage gradient is instantaneously lowered at the instant of sparking.

FIG. 7 illustrates the case where a partial discharge occurs between the wiring patterns P1 and P2 being tested. In the case where such partial discharge occurs, a current Ir flows into the resistor R between the wiring patterns P1 and P2 being tested. Unlike the case of sparking, however, the current flow into the resistor R is not so large in the case of partial discharge, and therefore the voltage V at the positive-side pattern P1 does not necessarily drop. However, typically a partial discharge continuously occurs over a certain time period. During the period that partial discharge continuously occurs, the rate of electrically charging the parasitic capacitor C will become slower because of the current Ir flowing into the resistor R between the wiring patterns. As illustrated in FIG. 7, consequently, the rate of rise in the voltage V will become slower (i.e., the voltage gradient becomes gently reduced during the period of partial discharge).

As described above, in the case where sparking or partial discharge occurs (in the case illustrated in FIG. 6 or 7), the voltage gradient is temporarily lowered. On the other hand, when no spark or partial discharge occurs (in the case illustrated in FIG. 5), the voltage gradient remains invariant during the gradient invariant period. Accordingly, it is possible to detect the occurrence of sparking or partial discharge by determining whether the voltage gradient remains invariant during the gradient invariant period.

The value of the voltage gradient ($\Delta V/\Delta t$) may differ for each wiring pattern because the parasitic capacitor C may differ for each wiring pattern. However, all the wiring patterns are the same as one another in that the voltage gradient remains invariant when no spark or partial discharge occurs between the wiring patterns. Accordingly, it is possible to detect, with high accuracy, sparking and partial discharge occurring at any wiring pattern, irrespective of differences in parasitic capacitor C for each wiring pattern, by detecting the sparking and partial discharge on the basis of whether the voltage gradient remains invariant, as described above.

Figure 4:
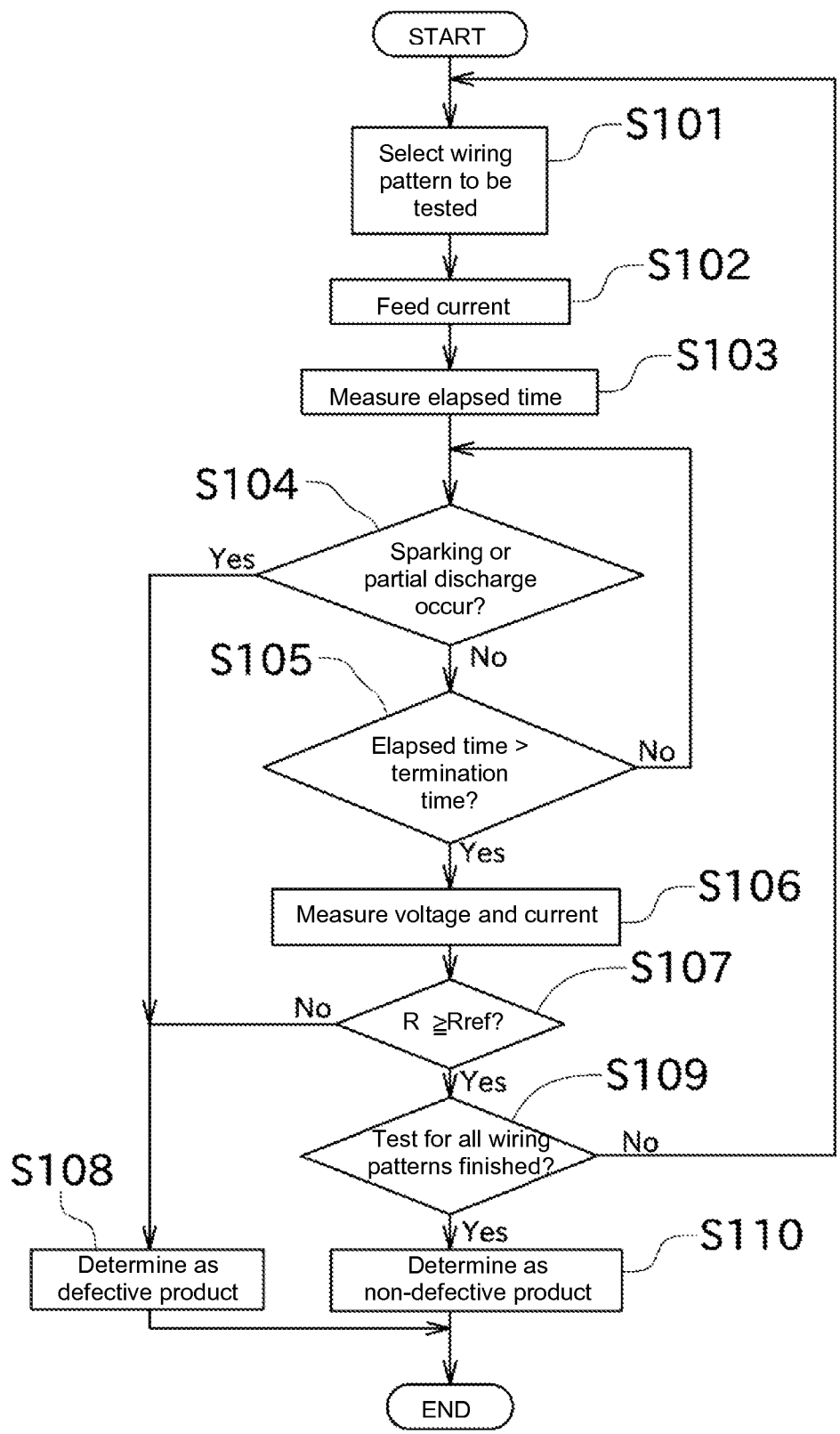
FIG. 4 is a flowchart of the insulation test performed by the testing apparatus.

According to this illustrative embodiment, in step S104 illustrated in FIG. 4, the controller 10 determines that no spark or partial discharge occurs, if the voltage gradient remains invariant during the gradient invariant period (in the case illustrated in FIG. 5), and also determines that sparking or partial discharge occurs, if the voltage gradient varies during this period (in the cases illustrated in FIG. 6 or 7).

Next, more specific description will be given of a configuration of the controller 10 for determining whether the voltage gradient remains invariant.

The controller 10 according to the embodiment has a function as a normal state voltage gradient calculation part 20 configured to calculate a voltage gradient in a normal state. In the description, the "normal state" refers to a state in which no spark or partial discharge occurs.

The normal state voltage gradient calculation part 20, according to an illustrative embodiment, calculates the voltage gradient in the normal state, based on measurements taken at relatively low voltage V levels because there is a low possibility that sparking or partial discharge will occur between the positive-side pattern P1 and a different wiring pattern when the voltage V at the positive-side pattern P1 is low. In other words, the state where the voltage V at the positive-side pattern P1 is substantially low can be regarded as the "normal state". As described above, however, the voltage gradient becomes unstable when the voltage V at the positive-side pattern P1 is close to zero. Accordingly, the voltage gradient in the normal state is not accurately calculated on the basis of measurements taken when the voltage V at the positive-side pattern P1 is extremely low (e.g., when the voltage V is close to zero).

Hence, as shown in FIG. 5, the normal state voltage gradient calculation part 20 calculates the voltage gradient in the normal state, based on measurements acquired during the period that the voltage V at the positive side patter P1 falls within a range which is equal to or more than the first threshold value and is less than a predetermined voltage gradient calculation threshold value (i.e., during the period defined as the "voltage gradient calculation period" shown in FIGS. 5 to 7). In order to calculate the voltage gradient in the normal state, at least two measurement results on the voltage V may be acquired during the voltage gradient calculation period. As shown in FIG. 5, the threshold values described above have the following magnitude relation of zero<first threshold value<voltage gradient calculation threshold value<second threshold value<upper-limit voltage.

The voltage gradient ΔV/Δt is expected to be invariant in the normal state (the state in which no spark or partial discharge occurs). In the case of such normal state (in the case where the voltage gradient remains invariant), accordingly, the voltage V at any time t can be estimated on the basis of the voltage gradient in the "normal state". The controller 10 may include a voltage estimation part 21 configured to estimate the voltage V at the positive-side pattern as a function of time t, on the basis of the voltage gradient in the normal state, and on the assumption that the voltage gradient remains invariant. In FIGS. 5 to 7, a two-dot straight chain line indicates the estimated value of the voltage V calculated by the voltage estimation part 21.

The controller 10 according to an illustrative embodiment also may include a determination part 22 configured to determine whether the voltage gradient remains invariant during the gradient invariant period, by comparing the measurement result on the voltage V in the gradient invariant period with the estimated value of the voltage V determined by the voltage estimation part 21.

As illustrated in FIG. 5, for example, in the case where the measurement result (shown with a circular symbol in FIG. 5) on the voltage V in the gradient invariant period is equal to the estimated value (shown with the two-dot straight chain line) of the voltage V by the voltage estimation part 21, the voltage gradient can be regarded to remain invariant in the gradient invariant period. Therefore, the determination part 22, according to this illustrative embodiment determines that the voltage gradient remains invariant in the gradient invariant period, when the measurement result on the voltage V in the gradient invariant period is equal to (or substantially equal to) the estimated value of the voltage V determined by the voltage estimation part 21. In this illustrative embodiment, the determination part 22 determines that the measurement result on the voltage V and the estimated value of the voltage V are equal to (or substantially equal to) each other when a difference between the measurement result and the estimated value is less than a predetermined determination threshold value [V].

As illustrated in FIG. 6 or 7, on the other hand, when the measurement result (the circular symbol) on the voltage V in the gradient invariant period is different from the estimated value (the two-dot straight chain line) of the voltage V determined by the voltage estimation part 21, the determination part 22 determines that the voltage gradient varies (the voltage gradient does not remain invariant) during the gradient invariant period. In an illustrative embodiment, the determination part 22 determines that the measurement result on the voltage V and the estimated value of the voltage V are different from each other, when the difference between the measurement result and the estimated value is equal to or more than the determination threshold value [V].

As described above, the voltage gradient remains invariant in the gradient invariant period when no spark or partial discharge occurs. Therefore, the determination part 22 determines that no spark or partial discharge occurs between the wiring patterns being tested, if the voltage gradient remains invariant in the gradient invariant period. In this case, the determination in step S104 is "No" in FIG. 4.

On the other hand, the determination part 22 determines that sparking or partial discharge occurs at the wiring patterns being tested, when it is determined that the voltage gradient varies in the gradient invariant period. In this case, the determination in step S104 is "Yes" in FIG. 4.

As described above, the testing apparatus 1 according to an illustrative embodiment includes a constant current source 11, a voltage measurement part 12, a normal state voltage gradient calculation part 20 and a determination part 22. The constant current source 11 feeds a constant current to a wiring pattern to be tested. The voltage measurement part 12 measures a voltage V at the wiring pattern. The normal state voltage gradient calculation part 20 calculates a voltage gradient in a normal state, by making voltage measurements at voltages below a predetermined voltage gradient calculation threshold value. The determination part 22 determines whether the voltage gradient remains invariant, by comparing a voltage measurement result between a first threshold value and a second threshold value (a measurement result in a gradient invariant period). with an estimated value of the voltage V based on the voltage gradient in the normal state. Then, the determination part 22 determines whether a circuit board is acceptable, on the basis of whether the voltage gradient remains invariant.

The testing apparatus 1, configured according to the embodiment described above, is capable of detecting not only sparking (FIG. 5), which could have been detected previously, but also partial discharge (FIG. 6), which has been difficult to detect previously.

An illustrative embodiment has been described above. However, the configuration described above may be modified as described below.

In the foregoing embodiment, a circuit board at which sparking or partial discharge occurs once is determined to be a defective product. However, several occurrences of sparking (or partial discharge) may be acceptable.

According to the conventional technique (Japanese Patent No. 3,546,046), occurrence of partial discharge cannot be detected, but occurrence of sparking can be detected. Therefore, the occurrence of sparking and the occurrence of partial discharge can be detected independently of each other by a combination of the conventional technique with the technique of the disclosure. If necessary, processing to be executed upon occurrence of sparking may be differentiated from processing to be executed upon occurrence of partial discharge.

In the foregoing embodiment, it is determined that the measurement result on the voltage V and the estimated value of the voltage V are equal to (or substantially equal to) each other in the case where the difference between the measurement result and the estimated value is less than the predetermined determination threshold value [V]. However, a criterion of determination that the measurement result on the voltage V is equal to the estimated value of the voltage V is not limited to that case. For example, it may be determined that the measurement result on the voltage V and the estimated value of the voltage V are equal to (or substantially equal to) each other in a case where the difference between the measurement result and the estimated value falls within a range of a predetermined ratio [%].

In the foregoing embodiment, the voltage gradient in the normal state is calculated on the basis of measurement on the voltage V. Alternatively, the voltage gradient in the normal state may be set at a specified value. However, the voltage gradient in the normal state differs for each wiring pattern. Moreover, a voltage gradient of an actual wiring pattern in the normal state may differ slightly for each circuit board because of individual variability, and the like. Therefore, the voltage gradient of each wiring pattern in the normal state is difficult to accurately specify in advance. According to the foregoing embodiment, in this respect, the voltage gradient in the normal state is calculated for each wiring pattern to be tested, on the basis of actual measurements of the voltage V. Therefore, it is possible to accurately calculate the voltage gradient in the normal state for each wiring pattern. Thus, it is possible to accurately detect sparking and partial discharge occurring at any wiring pattern, without an influence of the difference in voltage gradient among the wiring patterns, by detecting sparking or partial discharge on the basis of the voltage gradient calculated as described above in the normal state.

In the foregoing embodiment, the estimated value of the voltage V is calculated on the basis of the voltage gradient in the normal state, and the estimated value is compared with the measurement result on the voltage V. Thus, it is confirmed whether the voltage gradient remains invariant. However, a method of confirming whether the voltage gradient remains invariant is not limited to the method described above, and appropriate other methods may be employed. For example, each time a latest measurement result is obtained on the voltage V, a latest voltage gradient is calculated on the basis of a difference between the measurement result and a preceding measurement result, so that a variation of the voltage gradient may be monitored.

The foregoing disclosure has been specifically described and illustrated in connection with certain illustrative embodiments. However, it is clearly understood that the embodiments are by way of illustration and example only and are not to be taken by way of limitation. The spirit and scope of the invention are limited only by the terms of the appended claims.

What is claimed is:

1. A testing apparatus for testing electrical insulation between one or more wiring patterns formed on a circuit board, comprising:
    a constant current source;
    a voltage measurement part;
    at least one probe configured to be connected to at least one wiring pattern to be tested, wherein the constant current source is configured to feed a constant current to the wiring pattern to be tested;
    switch circuitry arranged to facilitate current flow from the constant current source across the wiring pattern of the circuit board to be tested;
    a limiter circuit arranged to prevent a potential difference between a positive-side terminal and a negative-side terminal of said constant current source from exceeding an upper-limit voltage;
    wherein the voltage measurement part is configured to measure voltages at the wiring pattern as a function of time when said constant current is fed, and
    a controller configured to calculate a normal state voltage gradient based on a voltage measurement made below a predetermined voltage gradient calculation threshold value,
    wherein said controller determines whether the measured voltages result in a measured voltage gradient that is substantially invariant from the normal state voltage gradient when the measured voltages are between a first and a second threshold value, wherein the limiter circuit sets the upper-limit voltage to be greater than the first and second threshold value.

2. The testing apparatus of claim 1, wherein said controller generates estimated voltage values above said predetermined voltage gradient calculation threshold value based on the normal state voltage gradient, and determines whether the measured voltage gradient is invariant above said predetermined voltage gradient calculation threshold by comparing the measured voltages to the estimated voltage values.

3. The testing apparatus of claim 2, wherein said controller determines whether the measured voltage gradient is invariant over a predetermined time interval.

4. The testing apparatus of claim 1, wherein said controller determines whether the measured voltage gradient is invariant over a predetermined time interval.

5. The testing apparatus of claim 1, wherein said controller determines whether said circuit board has acceptable insulation based on testing of said one or more wiring patterns.

6. The testing apparatus of claim 1, wherein said controller can determine the occurrence of both sparking and partial discharge across wiring patterns during testing.

7. The testing apparatus of claim 1, wherein said controller can distinguish between the occurrence of sparking and partial discharge across wiring patterns based on variations in the measured voltage gradient.

8. The testing apparatus of claim 1, further including a current measurement part for measuring the current fed to the wiring patterns being tested.

9. The testing apparatus of claim 8, wherein said controller calculates the electrical resistance between wiring patterns based on current and voltage measurements.

10. The testing apparatus of claim 1, wherein the controller determines that the wiring patterns have acceptable insulation when the measured voltage gradient is substantially invariant from the normal state voltage gradient.

11. A testing apparatus for determining whether a circuit board is acceptable based on testing electrical insulation between a plurality of wiring patterns formed thereon, comprising:
    a constant current source configured to supply a constant current;
    a first probe configured to electrically connect to a first of a pair of wiring patterns to a first terminal of the constant current source via a switch circuit, and a second probe configured to electrically connect to the second of the pair of wiring patterns to a second terminal of the constant current source via the switch circuit;

a limiter circuit arranged to limit a potential between a positive-side terminal and a negative-side terminal of said constant current source from exceeding an upper-limit voltage;

a voltage measuring part for measuring voltages as a function of time across the first wiring pattern when said constant current is applied, and a controller for calculating a normal state voltage gradient based on voltage measurements made below a predetermined voltage gradient calculation threshold value, wherein said controller determines whether the measured voltage exhibits a measured voltage gradient that is substantially invariant from the normal state voltage gradient over a predetermined time interval, the measured voltage being between a first and a second threshold value, wherein the limiter circuit sets the upper limit-voltage to be greater than the first and second threshold value.

12. The testing apparatus of claim 11, further comprising a current measuring part to measure the current output from said constant current source.

13. The testing apparatus of claim 11, wherein said controller further determines if said circuit board is acceptable by calculating the electrical resistance between wiring patterns based on current and voltage measurements.

14. The testing apparatus of claim 11, wherein said controller generates estimated voltage values above a predetermined voltage gradient calculation threshold value based on the normal state voltage gradient, and determines whether the measured voltage gradient is invariant above said predetermined voltage gradient calculation threshold value by comparing the measured voltages to the estimated voltage values.

15. A method of testing a circuit board to determine whether there is adequate electrical insulation between wiring patterns formed thereon, comprising the steps of:
 a) passing a constant current to a first pair of wiring patterns connected to a constant current source via a switch circuit and a probe;
 b) calculating a normal state voltage gradient, based on voltage measurements made below a predetermined voltage gradient calculation threshold value;
 c) measuring voltages across the first of the pair of wiring patterns as a function of time and determining therefrom a measured voltage gradient, the measured voltages across the wiring patterns being limited below an upper-limit voltage threshold value by a limiter circuit; and
 d) determining that neither sparking nor partial discharge has occurred if the measured voltage gradient is invariant from the normal state gradient over a predetermined time interval.

16. The method of claim 15, further including the step e) of calculating the electrical resistance between said pairs of wiring patterns to determine if there is adequate electrical insulation between said wiring patterns.

17. The method of claim 16, wherein a determination is made that there is adequate electrical insulation if the electrical resistance is greater than a predetermined threshold value.

18. The method of claim 16, wherein steps a)-d) are repeated for different pairs of wiring patterns.

19. The method of claim 18, further including the step of determining if said circuit board is acceptable on whether tested wiring patterns have adequate electrical insulation.

* * * * *